United States Patent
Ishihara

(10) Patent No.: US 11,696,446 B2
(45) Date of Patent: Jul. 4, 2023

(54) SEMICONDUCTOR STORAGE DEVICE WITH CONTACT MELTING PREVENTION

(71) Applicant: Kioxia Corporation, Tokyo (JP)

(72) Inventor: Hanae Ishihara, Yokkaichi Mie (JP)

(73) Assignee: KIOXIA CORPORATION, Tokyo (JP)

(*) Notice: Subject to any disclaimer, the term of this patent is extended or adjusted under 35 U.S.C. 154(b) by 69 days.

(21) Appl. No.: 17/010,190

(22) Filed: Sep. 2, 2020

(65) Prior Publication Data
US 2021/0225860 A1    Jul. 22, 2021

(51) Int. Cl.
H10B 43/50    (2023.01)
H10B 43/35    (2023.01)
H01L 23/535    (2006.01)
H01L 23/522    (2006.01)
H10B 43/10    (2023.01)
H10B 43/27    (2023.01)
H10B 43/40    (2023.01)

(52) U.S. Cl.
CPC ......... *H10B 43/50* (2023.02); *H01L 23/5226* (2013.01); *H01L 23/535* (2013.01); *H10B 43/10* (2023.02); *H10B 43/27* (2023.02); *H10B 43/35* (2023.02); *H10B 43/40* (2023.02)

(58) Field of Classification Search
CPC .......... H01L 27/115–11597; H10B 20/00–65; H10B 41/00–70; H10B 69/00
See application file for complete search history.

(56) References Cited

U.S. PATENT DOCUMENTS

2018/0277477 A1* 9/2018 Ishihara ................ H01L 23/528

\* cited by examiner

*Primary Examiner* — Didarul A Mazumder
*Assistant Examiner* — Gustavo G Ramallo
(74) *Attorney, Agent, or Firm* — Foley & Lardner LLP

(57) ABSTRACT

A semiconductor storage device includes a memory cell array including a stacked body having insulating layers and conductive layers that are alternately stacked. The memory cell array includes a cell area and a contact area provided adjacent the cell area. The semiconductor storage device includes: a circuit below the memory cell array; a source layer between the memory cell array and the circuit; a first contact in the contact area, and coupled to the circuit; a second contact over the cell area and the contact area; a first wiring extending in a direction intersecting an extending direction of the second contact in the contact area; a second wiring above the second contact, extending along the second contact in the contact area, and connected to the first wiring; and third contacts between the second wiring and the second contact.

18 Claims, 15 Drawing Sheets

SEMICONDUCTOR STORAGE DEVICE WITH CONTACT MELTING PREVENTION

CROSS-REFERENCE TO RELATED APPLICATION

This application is based upon and claims the benefit of priority from Japanese Patent Application No. 2020-005851, filed Jan. 17, 2020, the entire contents of which are incorporated herein by reference.

FIELD

Embodiments described herein relate generally to a semiconductor storage device.

BACKGROUND

In recent years, a semiconductor storage device including a three-dimensional memory cell array is developed. Memory cells of such a semiconductor storage device are three-dimensionally arranged. In the semiconductor storage device, a local wiring that connects a source layer provided below the memory cell array to an upper wiring is provided in a tap area between the adjacent memory cell arrays. The local wiring is formed by embedding a low resistance metal such as tungsten in a groove (a slit) in the tap area to prevent warpage of a substrate and to allow formation concurrently with contacts.

In addition, a current from the source layer flows from the local wiring to the upper wiring via a via contact. The current concentrates on the via contact between the local wiring and the upper wiring, which may melt the via contact.

DETAILED DESCRIPTION

Embodiments provide a semiconductor storage device capable of preventing melting of a via contact between a local wiring connected to a source layer and an upper wiring thereabove.

In general, according to one embodiment, a semiconductor storage device includes: a memory cell array including a stacked body having a plurality of insulating layers and a plurality of conductive layers are alternately stacked, wherein the memory cell array includes a cell area that includes a plurality of memory cells and a contact area provided adjacent the cell area; a circuit provided below the memory cell array; a source layer provided between the memory cell array and the circuit; a first contact provided in the contact area, and coupled to the circuit by extending along a stacking direction of the stacked body; a second contact provided over the cell area and the contact area, and coupled to the source layer by extending along the stacking direction; a first wiring extending in a direction intersecting an extending direction of the second contact in the contact area; a second wiring provided above the second contact, extending along the second contact in the contact area, and connected to the first wiring; and a plurality of third contacts provided between the second wiring and the second contact.

Hereinafter, an embodiment according to the present disclosure will be described with reference to the drawings. The embodiment does not limit the present disclosure. In the following embodiment, a vertical direction of a semiconductor substrate indicates a relative direction when a surface on which a semiconductor element is provided is defined as UP, and may be different from a vertical direction according to acceleration of gravity. The drawings are schematic or conceptual, and a proportion of each portion is not necessarily the same as that of the actual one. In the specification and drawings, the same elements as those described above with reference to the already illustrated drawings will be denoted by the same reference signs, and detailed description thereof will be appropriately omitted.

Figure 1:
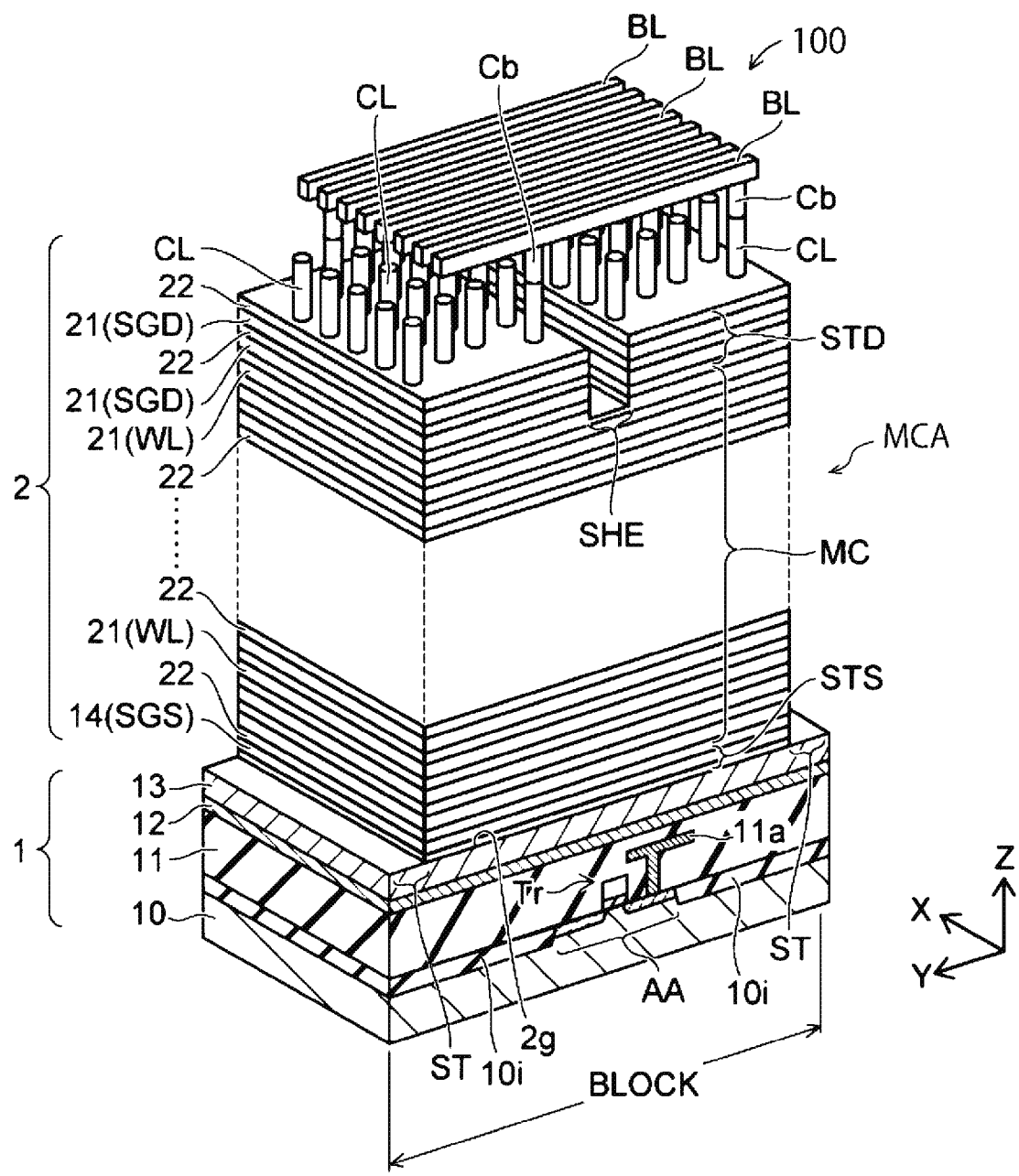
FIG. 1 is a perspective view illustrating an example of a configuration of a semiconductor storage device.

FIG. 1 is a perspective view illustrating an example of a configuration of a semiconductor storage device. A semiconductor storage device 100 may be, for example, a NAND type flash memory including a three-dimensional memory cell array MCA in which memory cells are three-dimensionally arranged. In the embodiment, a stacking direction of a stacked body 2 is defined as a Z direction. A direction that intersects the Z direction (for example, that is orthogonal the Z direction) is defined as a Y direction. A direction that intersects each of the Z and Y directions (for example, that is orthogonal to each of the Z and Y directions) is defined as an X direction.

The semiconductor storage device 100 includes abase body portion 1, the stacked body 2, and a plurality of columnar portions CL.

The base body portion 1 includes a substrate 10, an insulating film 11, a conductive film 12, and a semiconductor layer 13. The insulating film 11 is provided on the substrate 10. The conductive film 12 is provided on the insulating film 11. The semiconductor layer 13 is provided on the conductive film 12. The substrate 10 is a semiconductor substrate, for example, a p-type silicon substrate. For example, an element isolation area 10*i* is provided in a front surface area of the substrate 10. The element isolation area 10*i* is, for example, an insulating area containing a silicon oxide, and partitions an active area AA in the front surface area of the substrate 10. A source area and a drain area of a transistor Tr are provided in the active area AA. The transistor Tr forms a peripheral circuit (for example, a complementary metal oxide semiconductor (CMOS) circuit) of the nonvolatile memory. The insulating film 11 contains, for example, silicon oxide ($SiO_2$), and insulates the transistor Tr. A wiring 11*a* is provided in the insulating film 11. The wiring 11*a* is a wiring electrically connected to the transistor Tr. The conductive film 12 contains a conductive metal such as tungsten (W). The semiconductor layer 13 contains, for example, silicon. A conductivity type of silicon is, for example, an n-type. A part of the semiconductor layer 13 may contain undoped silicon.

The stacked body 2 is located in the Z direction with respect to the semiconductor layer 13. The stacked body 2 is configured such that a plurality of conductive layers 21 and a plurality of insulating layers 22 are alternately stacked along the Z direction. The conductive layer 21 contains a conductive metal, such as tungsten. For example, the insulating layer 22 contains a silicon oxide. The insulating layer 22 insulates the conductive layers 21 from each other. The number of layers of each of the conductive layer 21 and the insulating layer 22 is freely selected. The insulating layer 22 may be, for example, an air gap. For example, an insulating film 2*g* is provided between the stacked body 2 and the semiconductor layer 13. The insulating film 2*g* contains, for example, a silicon oxide ($SiO_2$). The insulating film 2*g* may contain a high dielectric having a relative dielectric constant higher than that of the silicon oxide. The high dielectric is, for example, a metal oxide.

The conductive layer 21 includes at least one source-side selection gate SGS, a plurality of word lines WL, and at least one drain-side selection gate SGD. The source-side selection gate SGS is a gate electrode of a source-side select transistor STS. The word line WL is a gate electrode of a memory cell MC. The drain-side selection gate SGD is a gate electrode of a drain-side select transistor STD. The source-side selection gate SGS is provided in a lower area of the stacked body 2. The drain-side selection gate SGD is provided in an upper area of the stacked body 2. The lower area refers to an area of the stacked body 2 on the side closer to the base body portion 1, and the upper area refers to an area of the stacked body 2 on the side farther from the base body portion 1. The word line WL is provided between the source-side selection gate SGS and the drain-side selection gate SGD.

Among the plurality of insulating layers 22, a thickness in the Z direction of the insulating layer 22 that insulates the source-side selection gate SGS and the word line WL may be thicker than, for example, a thickness in the Z-axis direction of the insulating layer 22 that insulates the word line WL and the word line WL. A cover insulating film may be provided on top of the insulating layer 22 that is farthest from the base body portion 1. The cover insulating film contains, for example, a silicon oxide.

The semiconductor storage device 100 includes a plurality of memory cells MC connected in series between the source-side select transistor STS and the drain-side select transistor STD. A structure in which the source-side select transistor STS, the memory cell MC, and the drain-side select transistor STD are connected in series is generally referred to as a "memory string" or a "NAND string". For example, the memory string is connected to a bit line BL via a via contact V0. The bit line BL is provided above the stacked body 2 and extends in the Y direction.

A plurality of deep slits ST and a plurality of shallow slits SHE are respectively provided in the stacked body 2. The "slit" indicates a groove and a portion including a conductor and/or an insulator embedded in the groove. The deep slit ST extends in the X direction, penetrates the stacked body 2 from an upper end of the stacked body 2 to the base body portion 1, and is provided in the stacked body 2. Although not illustrated in FIG. 1, the deep slit ST is filled with, for example, an insulator such as a silicon oxide film. Alternatively, the deep slit ST is filled with a conductor that is electrically connected to the semiconductor layer 13 while being electrically insulated from the stacked body 2 by an insulator. That is, the insulator covers an inner surface of the slit ST, and further the conductor is embedded inside the insulator. For example, a low resistance metal such as tungsten is used for this conductor. The conductor is connected to the semiconductor layer 13 in the slit ST. The shallow slit SHE extends in the X direction and is provided from the upper end of the stacked body 2 to the middle of the stacked body 2. Although not illustrated in FIG. 1, the shallow slit SHE is filled with, for example, an insulator such as a silicon oxide film.

As described above, the semiconductor storage device 100 according to the embodiment includes the memory cell array MCA and the peripheral circuit (the CMOS circuit) located below the memory cell array MCA. The semiconductor layer 13 provided between the memory cell array MCA and the peripheral circuit functions as a source layer of the memory cell array MCA.

Figure 2:
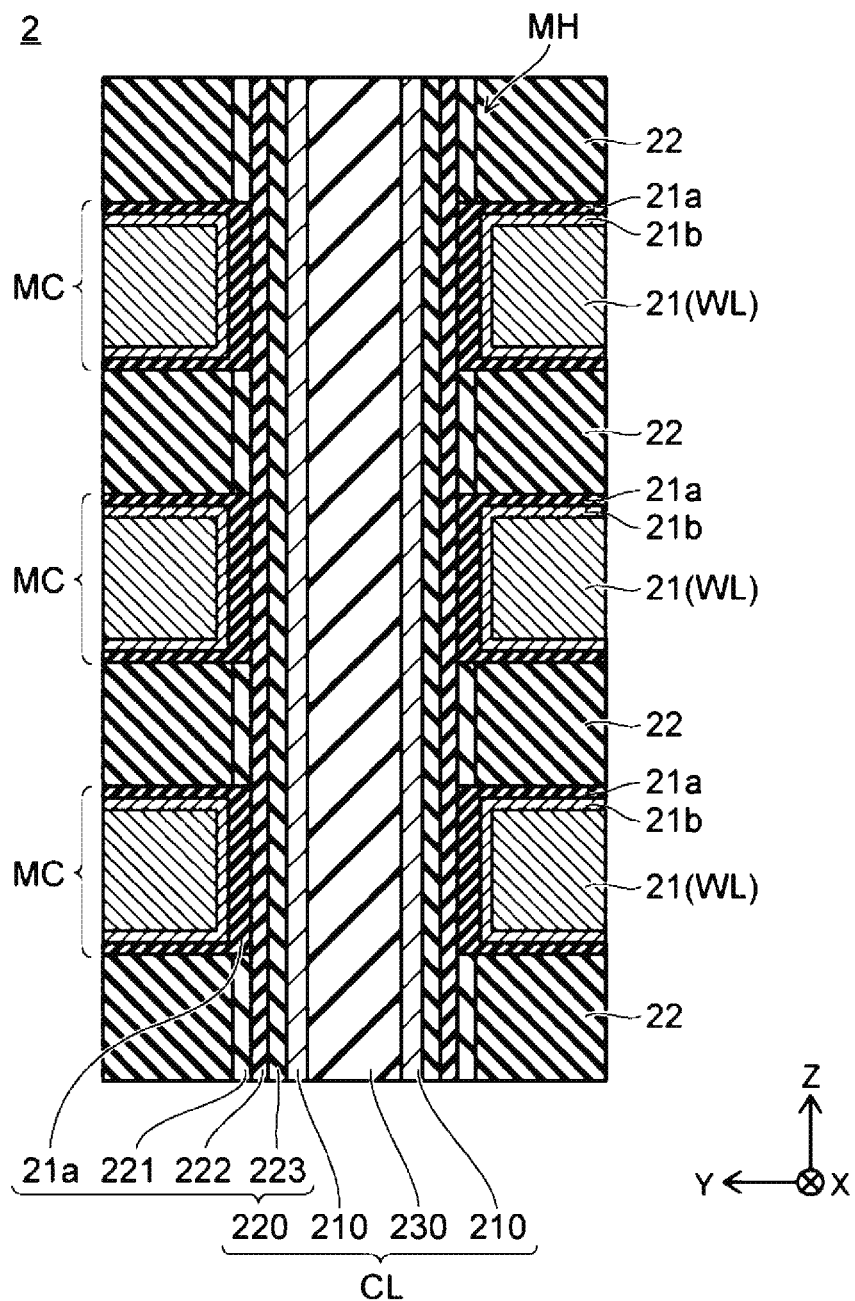
FIG. 2 is a cross-sectional view illustrating an example of a configuration of a columnar portion.

FIG. 2 is a cross-sectional view illustrating an example of a configuration of a columnar portion CL. Each of the plurality of columnar portions CL is provided in a memory hole MH provided in the stacked body 2. The memory hole MH penetrates the stacked body 2 from the upper end of the stacked body 2 along the Z direction, and is provided in the stacked body 2 and the semiconductor layer 13. Each of the plurality of columnar portions CL includes a semiconductor body 210, a memory film 220, and a core layer 230. The semiconductor body 210 is electrically connected to the semiconductor layer 13. The memory film 220 includes a charge trapping portion between the semiconductor body 210 and the conductive layer 21. A plurality of columnar portions CL respectively selected one by one from each finger, which will be described later, are commonly connected to one bit line BL via the via contact V0. Each of the columnar portions CL is provided in, for example, a memory cell array area.

Figure 3:
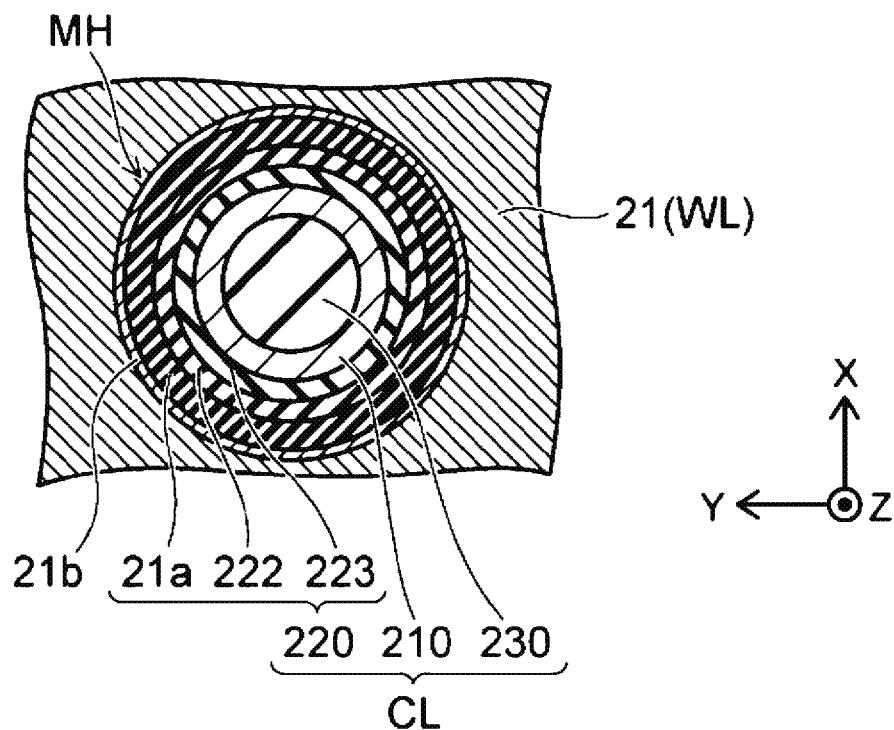
FIG. 3 is a plan view illustrating an example of the configuration of the columnar portion.

FIG. 3 is a plan view illustrating an example of the configuration of the columnar portion CL. A shape of the memory hole MH on the XY plane is, for example, a circle or an ellipse. A block insulating film 21*a* forming a part of the memory film 220 may be provided between the conductive layer 21 and the insulating layer 22. The block insulating film 21*a* is, for example, a silicon oxide film or a metal oxide film. One example of a metal oxide is an aluminum oxide. A barrier film 21*b* may be provided between the conductive layer 21 and the insulating layer 22 and between the conductive layer 21 and the memory film 220. For example, when the conductive layer 21 is tungsten, a stacked structure film of a titanium nitride and titanium is selected as the barrier film 21*b*. The block insulating film 21*a* prevents back tunneling of charges from the conductive layer 21 to the side of the memory film 220. The barrier film 21*b* improves adhesion between the conductive layer 21 and the block insulating film 21*a*.

A shape of the semiconductor body 210 is, for example, a cylindrical shape having a bottom. The semiconductor body 210 contains, for example, silicon. Silicon is, for example, polysilicon obtained by crystallizing amorphous silicon. The semiconductor body 210 is, for example, undoped silicon. The semiconductor body 210 may also be a p-type silicon. The semiconductor body 210 becomes respective channels of the drain-side select transistor STD, the memory cell MC, and the source-side select transistor STS.

In the memory film 220, portions other than the block insulating film 21a are provided between an inner wall of the memory hole MH and the semiconductor body 210. The memory film 220 has, for example, a cylindrical shape. A plurality of memory cells MC have a storage area between the semiconductor body 210 and the conductive layer 21 serving as the word line WL, and are stacked in the Z direction. The memory film 220 includes, for example, a cover insulating film 221, a charge trapping film 222, and a tunnel insulating film 223. Each of the semiconductor body 210, the charge trapping film 222, and the tunnel insulating film 223 extends in the Z direction.

The cover insulating film 221 is provided between the insulating layer 22 and the charge trapping film 222. The cover insulating film 221 contains, for example, a silicon oxide. The cover insulating film 221 protects the charge trapping film 222 from being etched when replacing a sacrifice film (not illustrated) with the conductive layer 21 (a replacement process). The cover insulating film 221 may be removed from between the conductive layer 21 and the memory film 220 in the replacement process. In this case, as illustrated in FIGS. 2 and 3, for example, the block insulating film 21a is provided between the conductive layer 21 and the charge trapping film 222. When the replacement process is not used for forming the conductive layer 21, the cover insulating film 221 may be omitted.

The charge trapping film 222 is provided between the block insulating film 21a, the cover insulating film 221, and the tunnel insulating film 223. The charge trapping film 222 contains, for example, a silicon nitride, and has a trap site for trapping charges in the film. A portion of the charge trapping film 222 interposed between the conductive layer 21 that becomes the word line WL and the semiconductor body 210 forms a storage area of the memory cell MC as a charge trapping portion. A threshold voltage of the memory cell MC changes depending on the presence or absence of charges in the charge trapping portion or an amount of charges trapped in the charge trapping portion. Accordingly, the memory cell MC stores information.

The tunnel insulating film 223 is provided between the semiconductor body 210 and the charge trapping film 222. The tunnel insulating film 223 contains, for example, a silicon oxide, or a silicon oxide and a silicon nitride. The tunnel insulating film 223 is a potential barrier between the semiconductor body 210 and the charge trapping film 222. For example, when injecting an electron from the semiconductor body 210 into the charge trapping portion (in a write operation), and when injecting a hole from the semiconductor body 210 into the charge trapping portion (in an erase operation), the electron and the hole respectively pass through (tunneling) the potential barrier of the tunnel insulating film 223.

The core layer 230 embeds an internal space of the cylindrical semiconductor body 210. For example, the core layer 230 has a columnar shape. The core layer 230 contains, for example, a silicon oxide, and has insulation properties.

Figure 4:
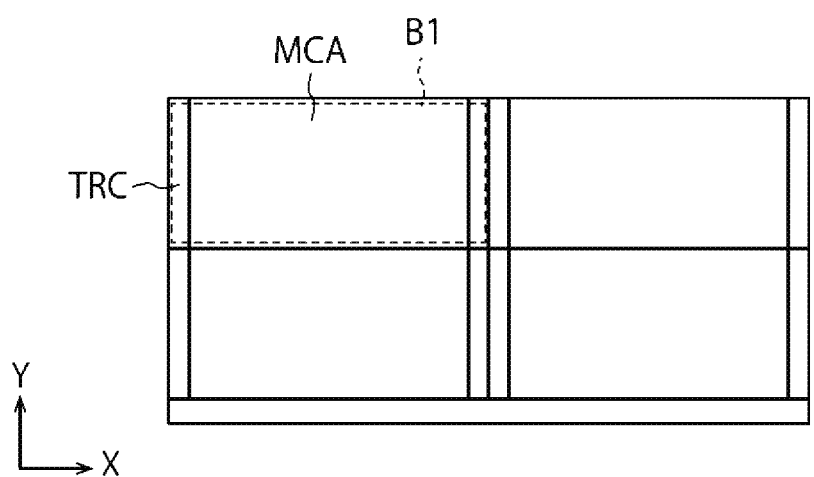
FIG. 4 is a plan view illustrating an example of the configuration of the semiconductor storage device according to the embodiment.

FIG. 4 is a plan view illustrating an example of the configuration of the semiconductor storage device according to the embodiment. In the semiconductor storage device 100, in the same manner as that of FIG. 1, the word line WL extends in the X direction and the bit line BL extends in the Y direction. A terrace area TRC of the word line WL is provided on opposite sides in the X direction of the memory cell array MCA. The terrace area TRC is an area in which the word lines WL are processed into a staircase shape, and connects a contact plug to each word line WL. As illustrated in FIG. 1, the peripheral circuit, such as the CMOS circuit, that controls the memory cell array MCA is provided below the memory cell array MCA.

Figure 5:
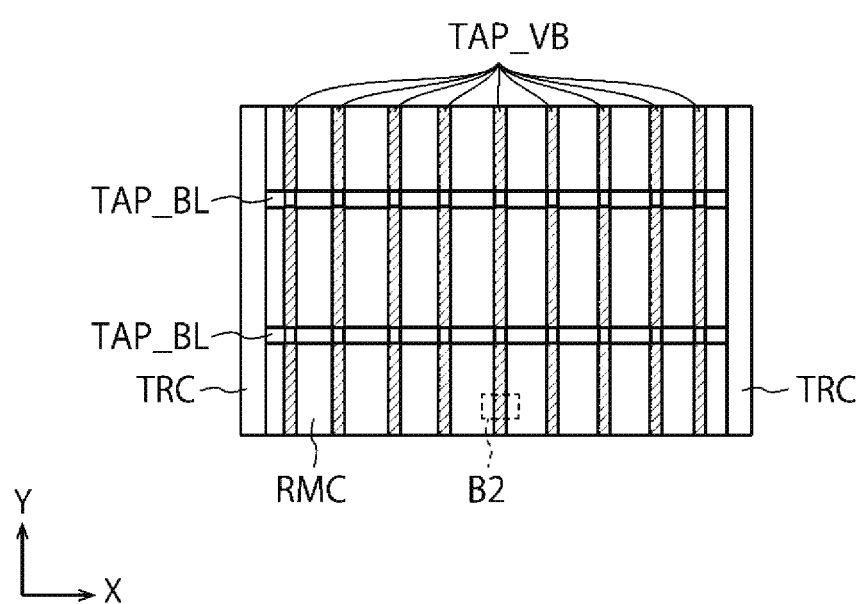
FIG. 5 is a plan view illustrating a memory cell array of a frame B1 in FIG. 4 in more detail.

FIG. 5 is a plan view illustrating a memory cell array MCA of a frame B1 in FIG. 4 in more detail. Two terrace areas TRC on the opposite sides of the memory cell array MCA are provided, and a cell area RMC and tap areas TAP_BL and TAP_VB are provided in the memory cell array MCA. The cell area RMC is an area including a plurality of memory cells MC, and includes a plurality of columnar portions CL. The tap area TAP_BL is a contact area for forming a contact plug in order to connect the bit line BL to the CMOS circuit below the memory cell array MCA. The tap area TAP_VB is a contact area for forming a contact plug not only for connecting power (not illustrated) to the CMOS circuit but also for connecting a source voltage to the semiconductor layer 13.

Figure 6:
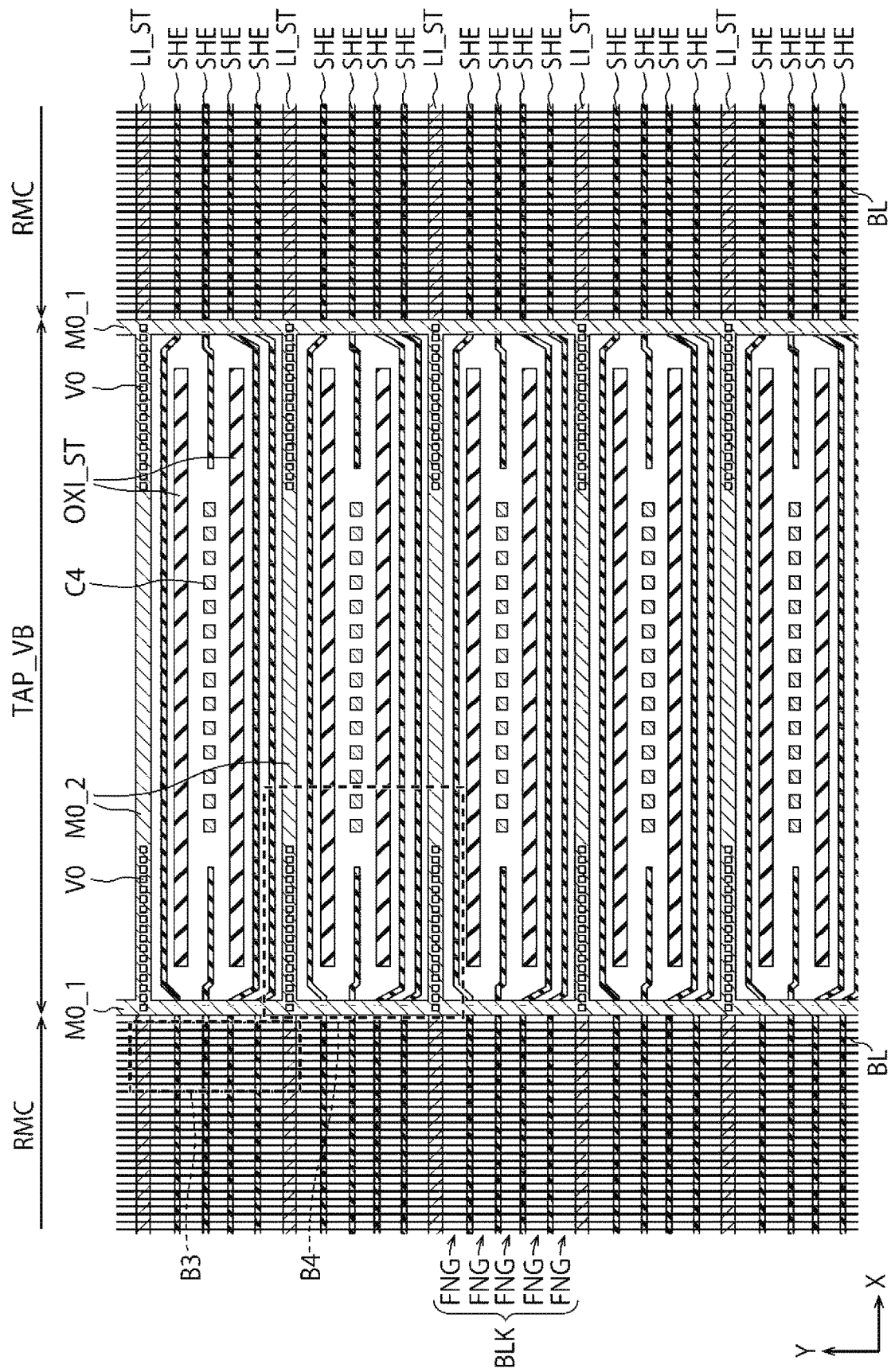
FIG. 6 is a plan view illustrating a tap area of a frame B2 in FIG. 5 in more detail.

FIG. 6 is a plan view illustrating the tap area TAP_VB of a frame B2 in FIG. 5 in more detail. As described above, the memory cell array MCA includes the cell area RMC and the tap area TAP_VB. The tap area TAP_VB is a contact area provided between two adjacent cell areas RMC.

The deep slit ST includes a conductor slit LI_ST and an insulator slit OXI_ST. In a planar layout viewed from the stacking direction of the stacked body 2 (the Z direction), the conductor slit LI_ST is provided over two adjacent cell areas RMC and the tap area TAP_VB provided between the two cell areas RMC. In the planar layout, the conductor slit LI_ST continuously extends in the X direction intersecting an extending direction (the Y direction) of the bit line BL (for example, orthogonal to the extending direction (the Y direction) of the bit line BL). As will be illustrated later with reference to FIG. 9, the conductor slit LI_ST is coupled to the semiconductor layer 13 as a source layer by penetrating the cell area RMC and the tap area TAP_VB in the stacking direction (the Z direction). Accordingly, the conductor slit LI_ST functions as a contact connected to the semiconductor layer 13, and can apply a predetermined source voltage to the semiconductor layer 13 from an upper wiring which is not illustrated. The conductor slit LI_ST is filled with a conductor (for example, tungsten) that is electrically connected to the semiconductor layer 13 while being electrically insulated from the stacked body 2 by an insulator (for example, a silicon oxide film).

In the planar layout viewed from the top, the insulator slit OXI_ST is provided in the tap area TAP_VB and extends in the X direction approximately parallel along the conductor slit LI_ST. Two insulator slits OXI_ST adjacent to each other in the Y direction are provided between the conductor slits LI_ST adjacent to each other in the Y direction, and are arranged on the opposite sides of a contact C4 so as to sandwich the contact C4. That is, the insulator slit OXI_ST is disposed between the conductor slit LI_ST and the contact C4 in the planar layout. The insulator slit OXI_ST is filled with, for example, an insulator such as a silicon oxide film. The insulator in the insulator slit OXI_ST may be an air gap.

When viewed from the top, the contact C4 is provided in the tap area TAP_VB, penetrates the tap area TAP_VB in the Z direction, and is provided up to the peripheral circuit therebelow. The contact C4 is provided, for example, in order to supply power to the peripheral circuit. A stacked body of an insulating layer having no conductive layer and a sacrifice layer remains between the two adjacent insulator slits OXI_ST, and the contact C4 penetrates the stacked body of the insulating layer and the sacrifice layer and is connected to the peripheral circuit. For example, a low resistance metal such as tungsten is used for the contact C4.

In the planar layout viewed from the top, the shallow slit SHE is provided in the two adjacent cell areas RMC and the tap area TAP_VB provided between the two cell areas RMC. In the planar layout, the shallow slit SHE continuously extends in the X direction intersecting the extending direction (the Y direction) of the bit line BL (for example, orthogonal to the extending direction (the Y direction) of the bit line BL). The shallow slit SHE is provided at an upper portion of the cell area RMC and the tap area TAP_VB in the stacking direction (the Z direction), and has a function of isolating the drain-side selection gate SGD. Therefore, in the tap area TAP_VB in which the stacked body 2 including the conductive layer is provided, a part of the shallow slits SHE is continuously provided in the planar layout. However, as shown in the isolated shallow slit SHE provided between the insulator slits OXI_ST in FIG. 6, the shallow slit SHE may be isolated in the tap area TAP_VB in which the stacked body of the insulating layer and the sacrifice layer is provided.

A memory cell array interposed between two conductor slits LI_ST adjacent to each other in the Y direction in the cell area RMC is referred to as a block BLK. The block BLK forms, for example, a minimum unit of data erase. In the cell area RMC, the memory cell array provided not only between the conductor slit LI_ST and the shallow slit SHE but also between the two shallow slits SHE adjacent to each other in the Y direction is referred to as a finger FNG. The drain-side selection gate SGD is divided for each finger FNG by the shallow slit SHE or the conductor slit LI_ST. The finger FNG forms, for example, a minimum unit of data read or data write. Accordingly, it is possible to selectively access one finger FNG in the block BLK via the drain-side selection gate SGD at the time of the data write and the data read.

A plurality of bit lines BL are provided on the cell area RMC. The bit line BL extends in the Y direction in the planar layout viewed from the stacking direction (the Z direction). For example, a low resistance metal such as copper, aluminum, and tungsten is used for the bit line BL.

The semiconductor storage device 100 according to the embodiment further includes wirings M0_1 and M0_2. In the planar layout viewed from the stacking direction (the Z direction), the wiring M0_1 is a wiring that extends in a direction intersecting an extending direction of the conductor slit LI_ST in the tap area TAP_VB (the Y direction). Each of the two wirings M0_1 is provided along a boundary between the two cell areas RMC on opposite sides of the tap area TAP_VB and the tap area TAP_VB. The wiring M0_1 is commonly connected to a plurality of wirings M0_2 provided in the tap area TAP_VB.

The wiring M0_2 is provided directly above the conductor slit LI_ST in the tap area TAP_VB, and extends along the conductor slit LI_ST in the planar layout viewed from the stacking direction (the Z direction). The wiring M0_2 extends between two wirings M0_1 provided on the opposite sides of a certain tap area TAP_VB, and connects the two wirings M0_1. In this manner, the wirings M0_1 and M0_2 are formed in a ladder shape in the planar layout.

The wirings M0_1 and M0_2 are wiring layers at an upper portion of the conductor slit LI_ST and the insulator slit OXI_ST, and are connected to each other. For example, a low resistance metal such as copper, aluminum, and tungsten is used for the wirings M0_1 and M0_2.

The wirings M0_1 and M0_2 are formed in the same wiring layer, and are formed in the same process. The wirings M0_1 and M0_2 and the bit line BL are also formed in the same wiring layer, and are formed in the same process. Accordingly, the wirings M0_1 and M0_2 and the bit line BL are formed of the same material.

An interlayer insulating film is provided between the wirings M0_1 and M0_2 and the conductor slit LI_ST. In the tap area TAP_VB, a plurality of via contacts V0 connect the wiring M0_1 and the conductor slit LI_ST, and also connect the wiring M0_2 and the conductor slit LI_ST via the interlayer insulating film (not illustrated in FIG. 6). For example, a low resistance metal such as tungsten is used for the via contact V0.

Figure 7:
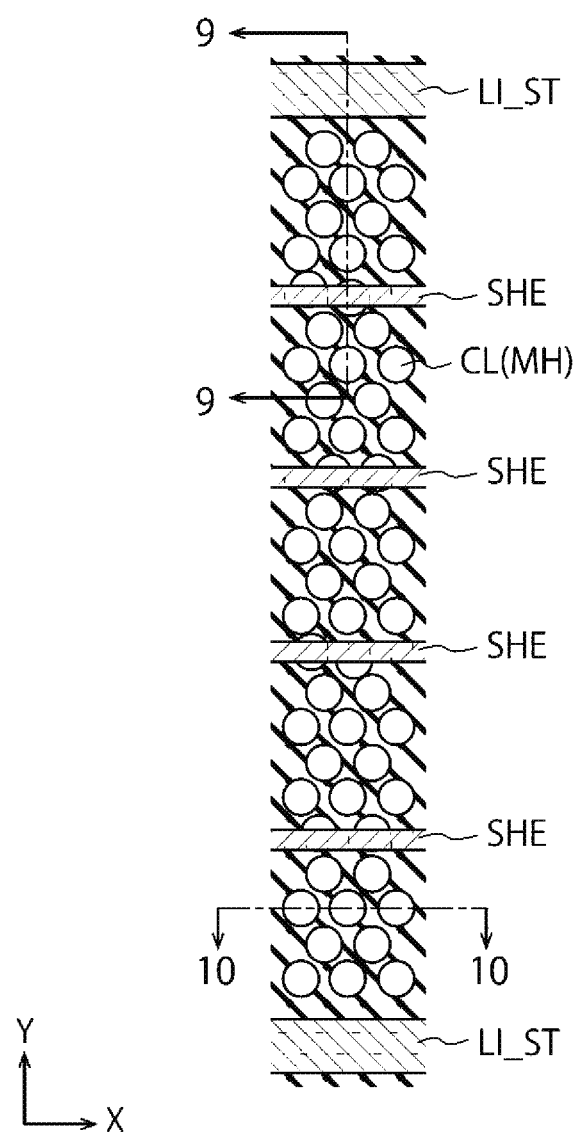
FIG. 7 is a plan view illustrating a part of a memory cell array of a frame B3 in FIG. 6 in more detail.

FIG. 7 is a plan view illustrating a part of a memory cell array of a frame B3 in FIG. 6 in more detail. The columnar portion CL, that is, the memory hole MH is disposed, in the planar layout, between two conductor slits LI_ST adjacent to each other in the Y direction in a manner of a hexagonal closest packing arrangement. The shallow slit SHE is provided on a part of the columnar portion CL. The columnar portion CL below the shallow slit SHE does not form a memory cell. In FIG. 7, the illustration of the bit line BL is omitted. A connection relationship between the columnar portion CL and the bit line BL will be illustrated with reference to FIG. 8.

Figure 8:
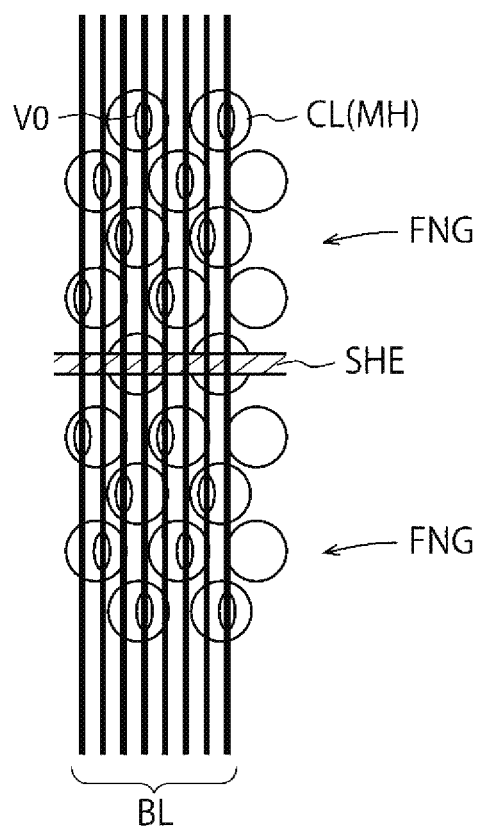
FIG. 8 is a plan view illustrating a connection relationship between the columnar portion and a bit line.

FIG. 8 is a plan view illustrating the connection relationship between the columnar portion CL and the bit line BL. The bit line BL is connected to the columnar portion CL via the via contact V0. The via contacts V0 are arranged in a staggered manner in the planar layout. Accordingly, each bit line BL is connected to only one columnar portion CL of the plurality of columnar portions CL in a certain finger FNG via the via contact V0.

Figure 9:
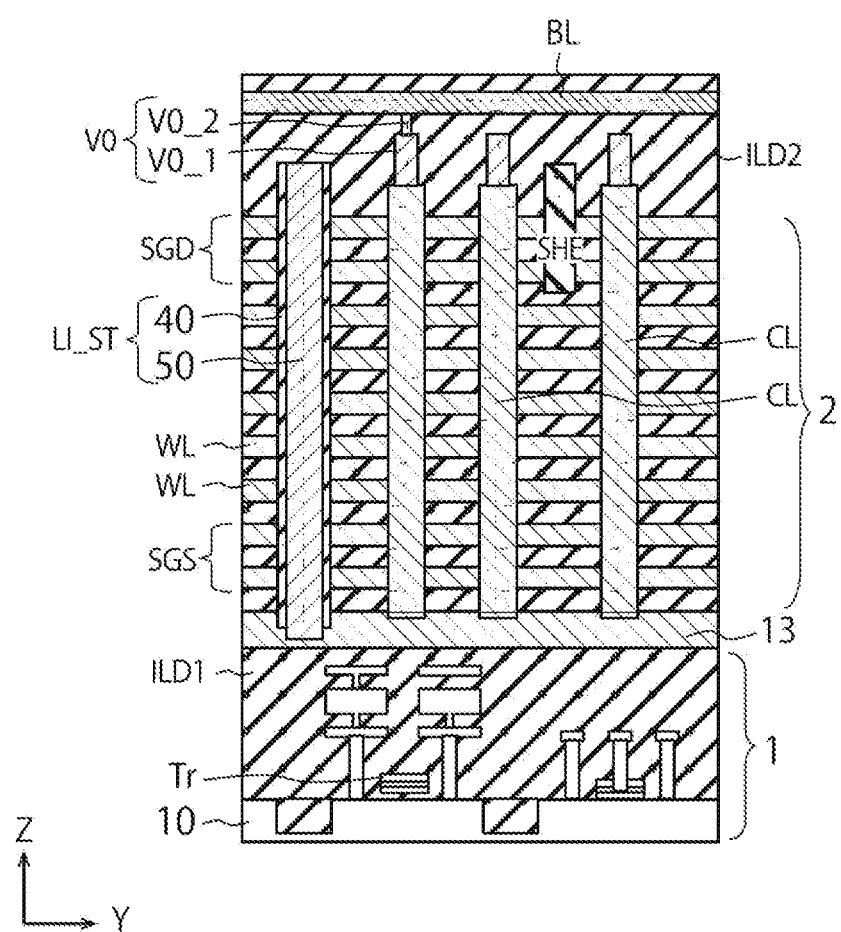
FIG. 9 is a cross-sectional view taken along a line 9-9 in FIG. 7.
Figure 10:
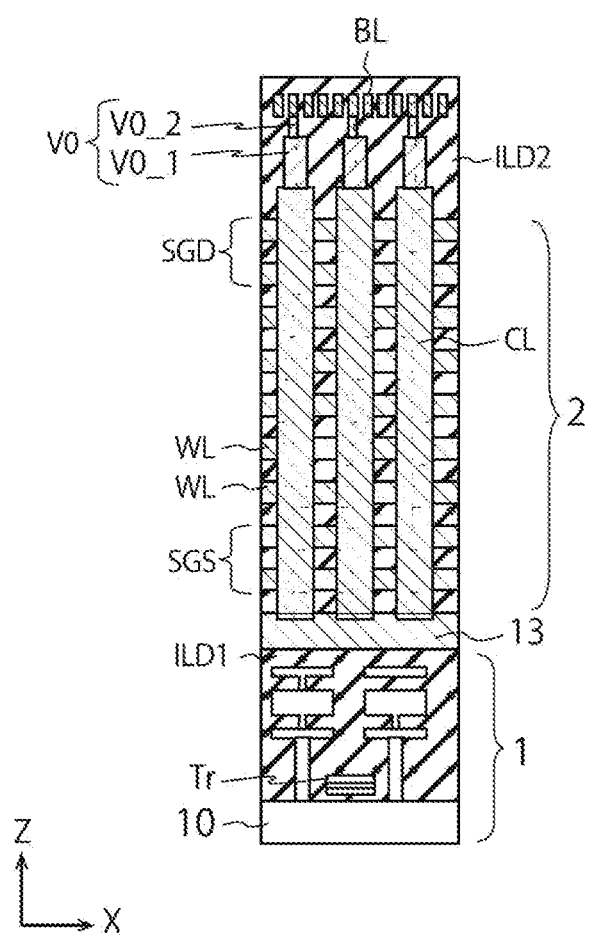
FIG. 10 is a cross-sectional view taken along a line 10-10 in FIG. 7.

FIG. 9 is a cross-sectional view taken along a line 9-9 in FIG. 7. FIG. 10 is a cross-sectional view taken along a line 10-10 in FIG. 7. As illustrated with reference to FIG. 1, a semiconductor element such as the transistor Tr is formed on the substrate 10 of the base body portion 1. The semiconductor element such as the transistor Tr forms the peripheral circuit such as the CMOS circuit. The peripheral circuit formed on the substrate 10 is covered with an interlayer insulating film ILD1. The semiconductor layer 13 functioning as a source layer is provided on the interlayer insulating film ILD1.

The stacked body 2 is provided on the semiconductor layer 13. The columnar portion CL penetrates the stacked body 2 and is provided up to the semiconductor layer 13. Accordingly, the semiconductor body 210 of the columnar portion CL is electrically connected to the semiconductor layer 13.

The conductor slit LI_ST also penetrates the stacked body 2 and is provided up to the semiconductor layer 13. The conductor slit LI_ST is provided in a groove that penetrates the stacked body 2 in the stacking direction in the cell area RMC and the tap area TAP_VB, and that is provided up to the semiconductor layer 13. The conductor slit LI_ST includes an insulating layer 40 that covers an inner surface of the groove and a conductor 50 embedded inside the insulating layer 40. The insulating layer 40 is interposed between the conductor 50 and the stacked body 2, and electrically insulates the conductor 50 from the word line WL, the source-side selection gate SGS, and the drain-side selection gate SGD. On the other hand, the conductor 50 is electrically connected to the semiconductor layer 13 at a bottom portion of the conductor slit LI_ST. That is, the conductor 50 is electrically connected to the semiconductor layer 13 in a state of being electrically insulated from the word line WL, the source-side selection gate SGS, and the drain-side selection gate SGD of the stacked body 2 by the insulating layer 40. Accordingly, the conductor slit LI_ST can apply a source voltage to the semiconductor layer 13 from the wirings M0_1 and M0_2 above the stacked body 2.

The shallow slit SHE cuts the drain-side selection gate SGD, and divides the columnar portion CL (that is, the memory cell array MCA) into each finger FNG.

The via contact V0 is provided between the bit line BL and the columnar portion CL corresponding thereto. An interlayer insulating film ILD2 is provided on the stacked body 2, and the via contact V0 is provided in the interlayer insulating film ILD2. The via contact V0 may be configured to be divided into a plurality of via contacts V0_1 and V0_2 up and down. The via contact V0_1 is, for example, a contact having a relatively wide (thick) width that is provided on all the columnar portions CL forming the memory cell MC. The via contact V0_2 is selectively provided on the via contact V0_1, and is a contact having a relatively narrow (thin) width that electrically connects the bit line BL and the columnar portion CL corresponding thereto. For example, a low resistance metal such as tungsten is used for the via contacts V0_1 and V0_2. The via contact V0 illustrated in FIG. 8 shows the planar layout of the via contact V0_2.

Figure 11:
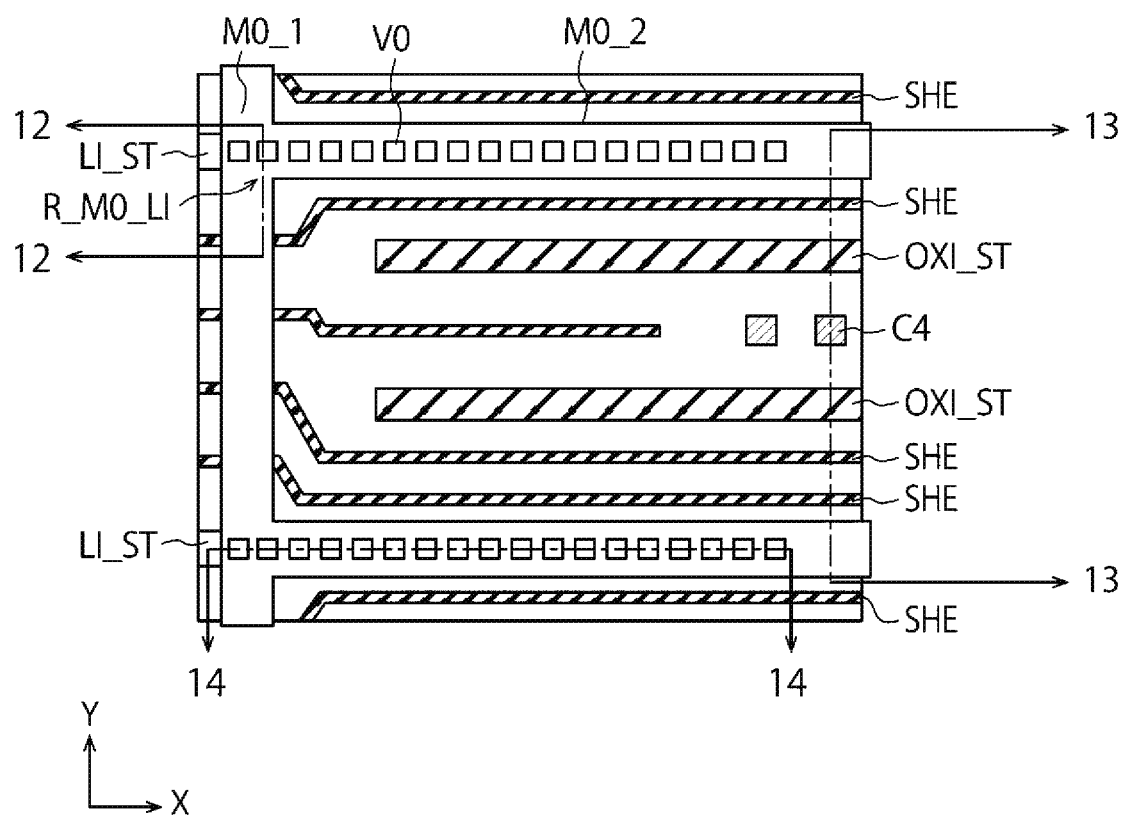
FIG. 11 is a plan view illustrating a part of a tap area of a frame B4 in FIG. 6 in more detail.

FIG. 11 is a plan view illustrating a part of a tap area TAP_VB of a frame B4 in FIG. 6 in more detail. The via contact V0 connects the bit line BL and the columnar portion CL in the cell area RMC. In the tap area TAP_VB, the via contact V0 is provided between the conductor slit LI_ST and the wiring M0_2 thereabove, and electrically connects the conductor slit LI_ST and the wiring M0_2. A plurality of via contacts V0 are arranged in the X direction along the conductor slit LI_ST and the wiring M0_2.

In the embodiment, the via contact V0 is also provided in an intersecting area R M0 LI of the conductor slit LI_ST and the wiring M0_1, and electrically connects the conductor slit LI_ST and the wiring M0_1. However, as long as the via contact V0 can connect the conductor slit LI_ST and the wiring M0_2 with low resistance, the via contact V0 may be provided only between the conductor slit LI_ST and the wiring M0_2.

Figure 12:
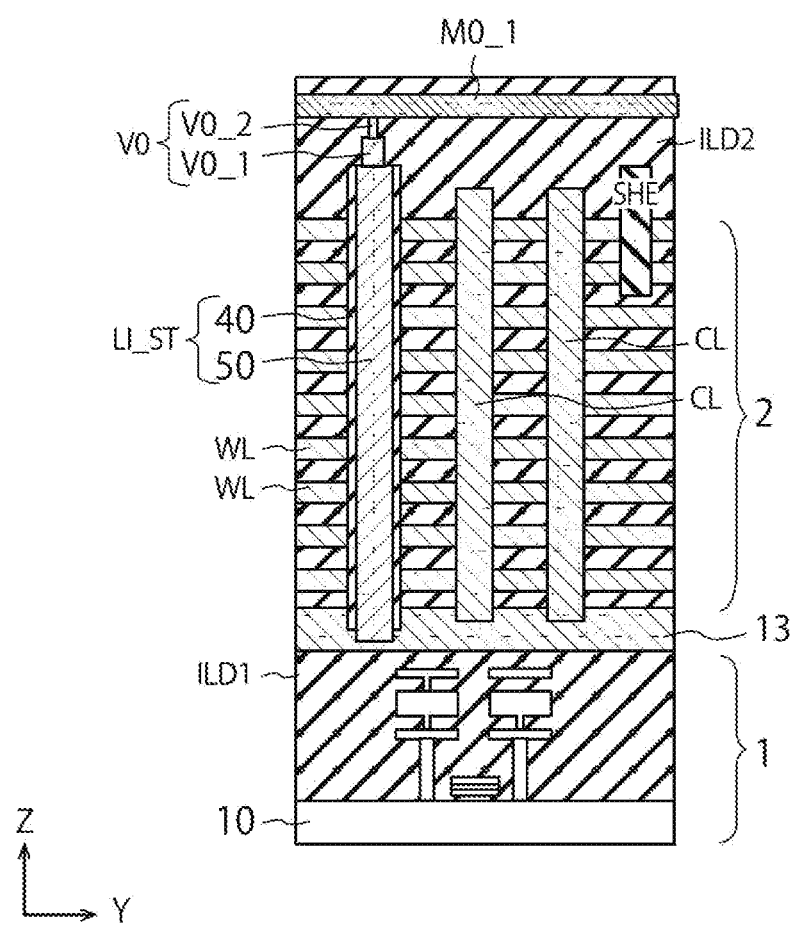
FIG. 12 is a cross-sectional view taken along a line 12-12 in FIG. 11.
Figure 13:
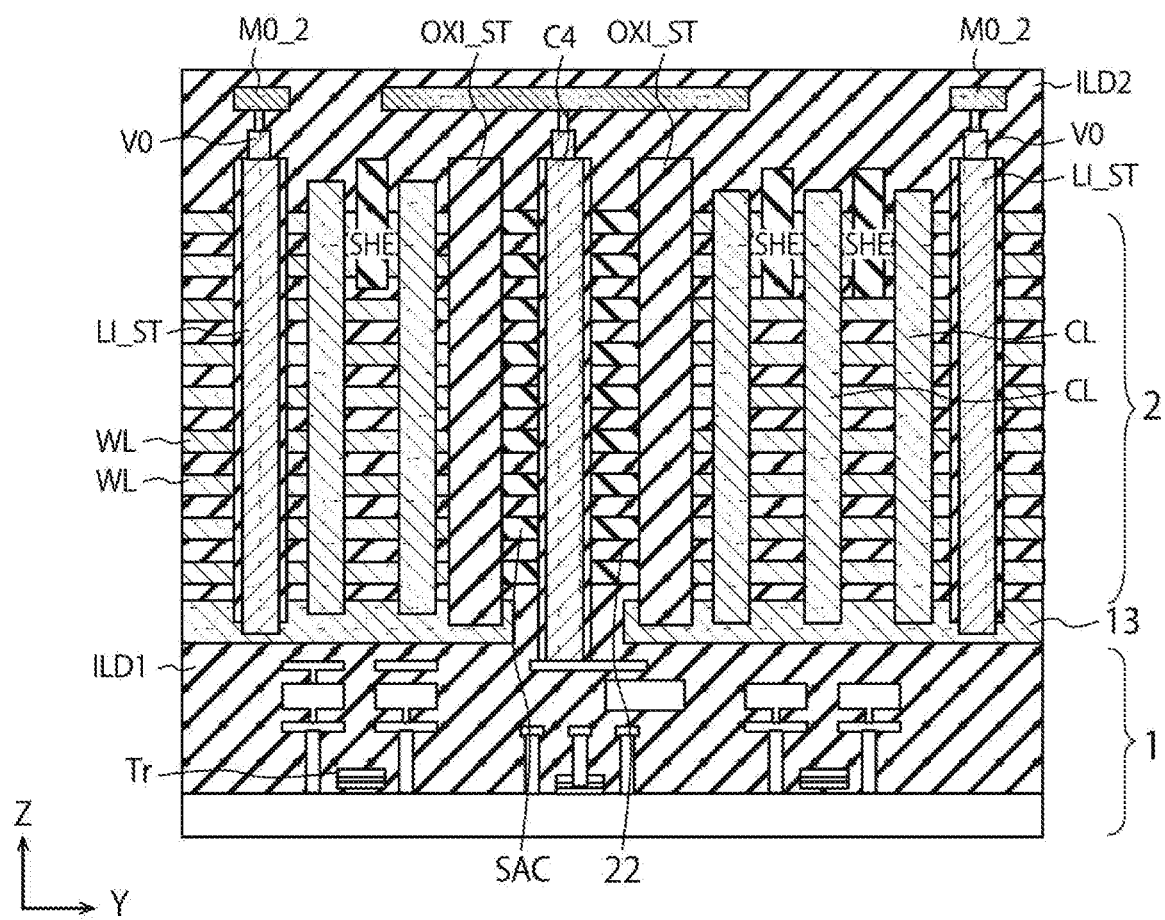
FIG. 13 is a cross-sectional view taken along a line 13-13 in FIG. 11.
Figure 14:
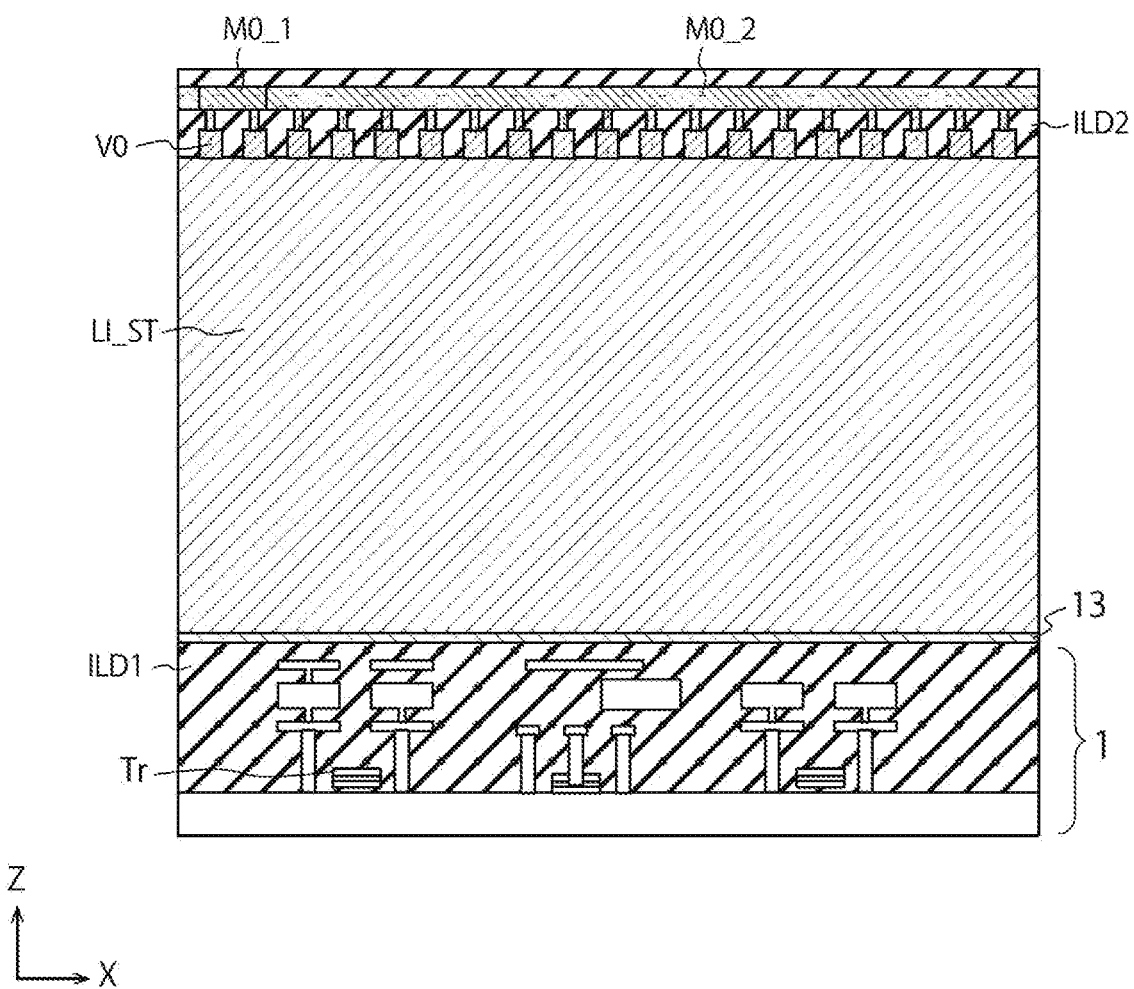
FIG. 14 is a cross-sectional view taken along a line 14-14 in FIG. 11.

FIG. 12 is a cross-sectional view taken along a line 12-12 in FIG. 11. FIG. 13 is a cross-sectional view taken along a line 13-13 in FIG. 11. FIG. 14 is a cross-sectional view taken along a line 14-14 in FIG. 11.

As illustrated in FIGS. 12 and 13, even in the tap area TAP_VB, the conductor slit LI_ST, the columnar portion CL, and the shallow slit SHE are provided in the same manner as that of the cell area RMC. However, the columnar portion CL does not function as the memory cell MC.

The via contact V0 is provided on the conductor slit LI_ST, and electrically connects the conductor slit LI_ST and the wiring M0_1 or the wiring M0_2. As illustrated in FIG. 14, a plurality of via contacts V0 are arranged along the wiring M0_2. The via contact V0 is provided in the interlayer insulating film ILD2 and electrically connects the conductor slit LI_ST and the wiring M0_2. Referring to FIG. 14, it can be seen that the wiring M0_2 extends approximately parallel along the conductor slit LI_ST above the conductor slit LI_ST. It can be seen that the conductor slit LI_ST is a plate-shaped member provided from an upper surface of the stacked body 2 to the semiconductor layer 13.

The insulator slit OXI_ST in FIG. 13 is provided between the contact C4 and the conductor slit LI_ST. The insulator slit OXI_ST is embedded in a groove that penetrates the stacked body 2 of the tap area TAP_VB in the stacking direction (the Z direction), and that is provided up to the semiconductor layer 13. The stacked body of the insulating layer 22 and a sacrifice layer SAC remains between the two adjacent insulator slits OXI_ST in the tap area TAP_VB. The sacrifice layer SAC is, for example, a silicon nitride film. In the cell area RMC, the sacrifice layer SAC is replaced with the conductive layer 21 (for example, tungsten) and replaced with the word line WL. However, between the insulator slits OXI_ST in the tap area TAP_VB, the insulator slit OXI_ST prevents etching of the sacrifice layer SAC, and the sacrifice layer SAC remains without being replaced therewith.

The contact C4 is provided in the stacked body of the sacrifice layer SAC and the insulating layer 22. The contact C4 penetrates the stacked body of the insulating layer 22 and the sacrifice layer SAC and is connected to any wiring of the peripheral circuit. For example, a low resistance metal such as tungsten is used for the contact C4.

As described above, the semiconductor storage device 100 according to the embodiment includes, in the tap area TAP_VB, the wiring M0_1 extending in the Y direction; and the wiring M0_2 extending in the X direction and provided directly above the conductor slit LI_ST. A plurality of via contacts V0 are provided at least between the wiring M0_2 and the conductor slit LI_ST. Accordingly, the wiring M0_2 and the conductor slit LI_ST are connected to each other with low resistance. Therefore, even though a relatively large source current flows, the source current dispersedly flows through a plurality of via contacts V0. This arrangement can prevent melting of the via contact V0 provided between the conductor slit LI_ST as a wiring connected to the semiconductor layer 13 and the wirings M0_1 and M0_2.

When the wiring M0_2 is not provided and the via contact V0 is provided only in the intersecting area between the wiring M0_1 and the conductor slit LI_ST, a resistance value between the wiring M0_1 and the conductor slit LI_ST may become relatively high. Therefore, even though a plurality of via contacts V0 are provided, the via contacts V0 may be melted by the large source current.

On the other hand, the semiconductor storage device 100 of the embodiment includes the wiring M0_2, and a relatively large number of via contacts V0 can be provided between the wiring M0_2 and the conductor slit LI_ST. Accordingly, even though the large source current flows, melting of the via contact V0 provided between the conductor slit LI_ST and the wirings M0_1 and M0_2 can be prevented.

When all the portions other than the insulating layer of the conductor slit LI_ST are filled with the low resistance metal such as tungsten, the conductor slit LI_ST has low resistance, thereby making it possible to allow the large source current to flow. What is described above accelerates the melting of the via contact V0. Therefore, when all the conductor portions of the conductor slit LI_ST are filled with the low resistance metal, particularly, a configuration according to the embodiment is effective for preventing the melting of the via contact V0.

[First Modification]

Figure 15:
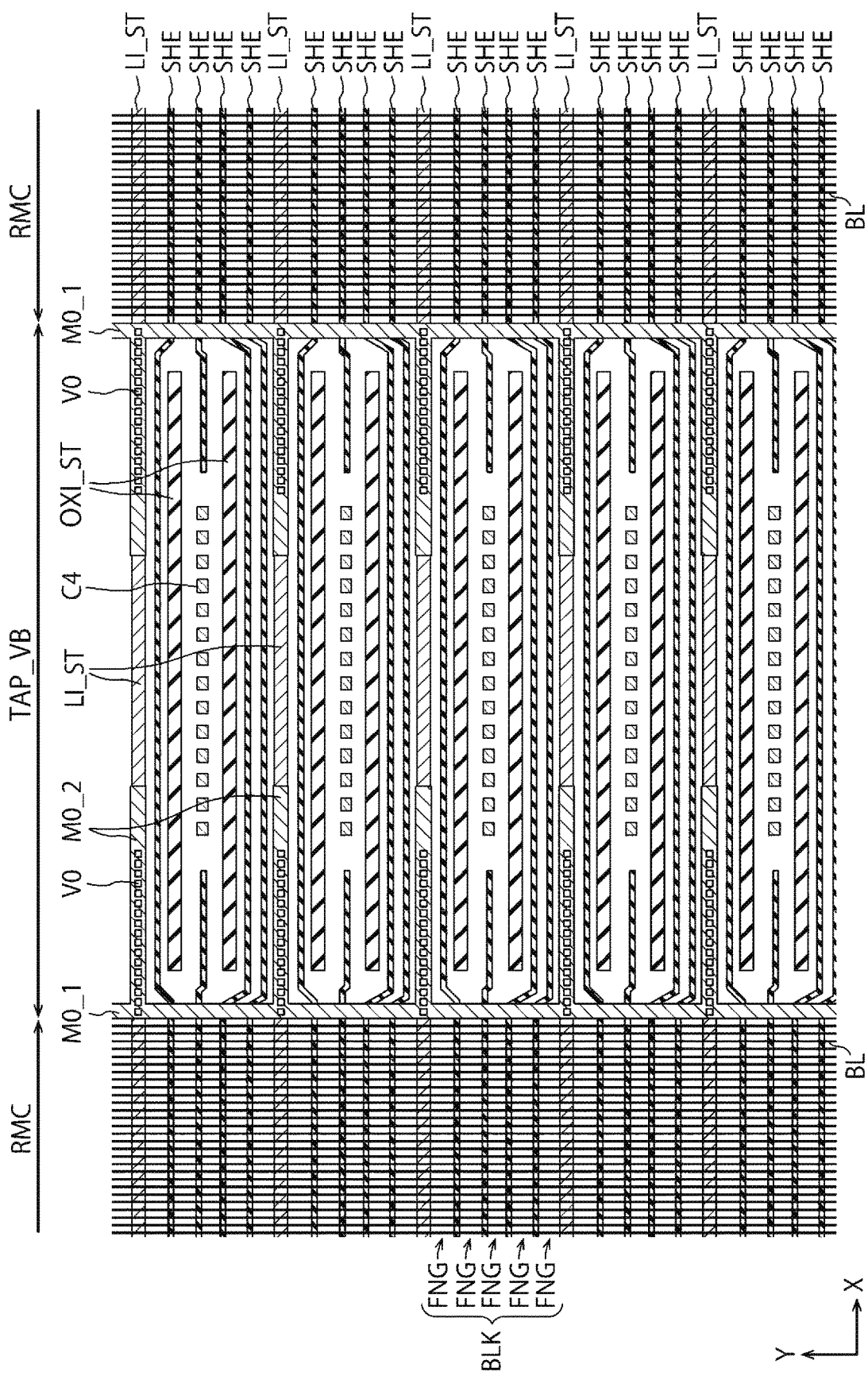
FIG. 15 is a plan view illustrating an example of a configuration of a semiconductor storage device according to a first modification.

FIG. 15 is a plan view illustrating an example of a configuration of a semiconductor storage device according to a first modification. In the first modification, each of the wirings M0_2 is isolatedly provided in a cell area RMCa on one side of the tap area TAP_VB and a cell area RMCb on the other side of the tap area TAP_VB. Other configurations of the first modification may be the same as the corresponding configurations of the above-described embodiment. As described above, even though the wiring M0_2 is isolated, a problem does not occur because the wiring M0_2 is connected to the wiring M0_1 via the via contact V0 with low resistance.

[Second Modification]

Figure 16:
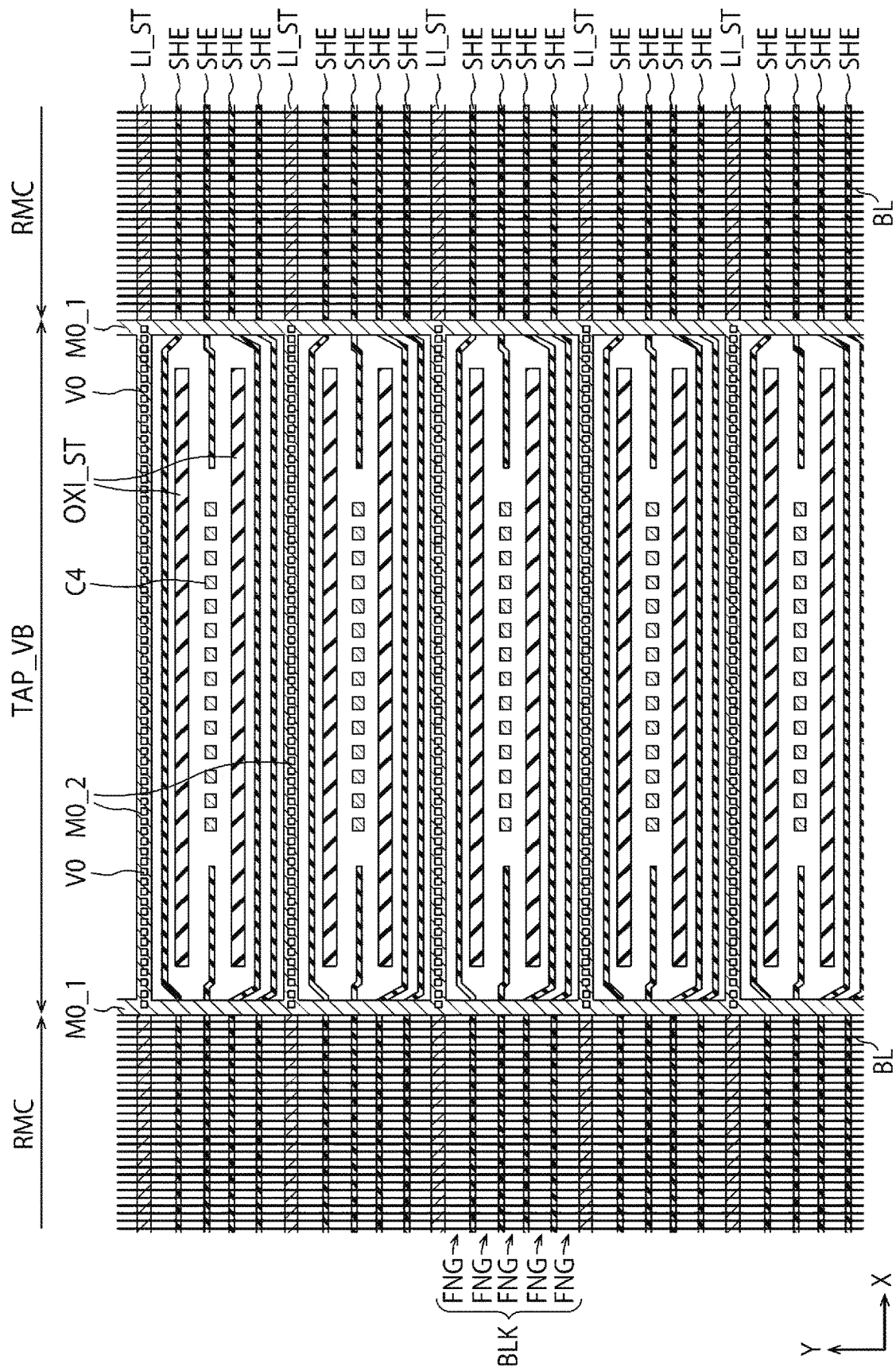
FIG. 16 is a plan view illustrating an example of a configuration of a semiconductor storage device according to a second modification.

FIG. 16 is a plan view illustrating an example of a configuration of a semiconductor storage device according to a second modification. In the second modification, the via contact V0 is arranged in the X direction over the whole wiring M0_2. Accordingly, the resistance between the wiring M0_2 and the conductor slit LI_ST becomes further lower. Other configurations of the second modification may be the same as the corresponding configurations of the above-described embodiment. As described above, the via contact V0 may be arranged in the whole wiring M0_2. The size and the number of via contacts V0 may be set according to the current flowing through the via contacts V0.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor storage device, comprising:
    a memory cell array including a stacked body having a plurality of insulating layers and a plurality of conductive layers are alternately stacked in a first direction, the memory cell array including a cell area that includes a plurality of memory cells and a contact area provided adjacent the cell area in a second direction crossing the first direction;
    a circuit provided below the memory cell array;
    a source layer provided between the memory cell array and the circuit;
    a first contact provided in the contact area, and coupled to the circuit by extending along the first direction through the stacked body;
    a second contact provided over the cell area and the contact area, and coupled to the source layer by extending in the first and second directions;
    a first wiring extending in a third direction crossing the first and second directions;
    a second wiring provided above the second contact, extending in the second direction along the second contact in the contact area, and connected to the first wiring; and
    a plurality of third contacts provided between the second wiring and the second contact;
    wherein the cell area further includes a first cell area and a second cell area, the contact area between the first cell area and the second cell area in the second direction.

2. The semiconductor storage device according to claim 1, further comprising:
    a plurality of fourth contacts provided in an intersecting area of the first wiring and the second contact, and connecting the first wiring and the second contact.

3. The semiconductor storage device according to claim 1, wherein
    the first and second wirings are provided in a same layer.

4. The semiconductor storage device according to claim 1, further comprising:
    a plurality of bit lines provided in the cell area, wherein
    the first wiring, the second wiring, and the plurality of bit lines are provided in a same layer.

5. The semiconductor storage device according to claim 1, wherein
    the second contact extends through the stacked body to the source layer over the cell area and the contact area, and includes an insulating film and a conductor, the insulating film surrounding the conductor.

6. The semiconductor storage device according to claim 1, wherein
    the first wiring and another first wiring are each provided along a boundary between the cell area and an adjacent cell area, which is on one of opposite sides of the contact area, and the two first wirings are commonly connected to the second wiring provided in the contact area.

7. The semiconductor storage device according to claim 1, wherein
    the second wiring connects the first wiring and another first wiring that are provided on opposite sides of the contact area, respectively.

8. The semiconductor storage device according to claim 1, wherein
    the second wiring is provided in the cell area on a first side of the contact area and another cell area on a second side of the contact area.

9. The semiconductor storage device according to claim 1, wherein the circuit includes a complementary metal oxide semiconductor circuit that is configured to control the memory cell array.

10. The semiconductor storage device according to claim 1, wherein the second contact provided in the first cell area, the second cell area and the contact area.

11. The semiconductor storage device according to claim 1, wherein the first wiring provided along the first cell area and the second cell area in the third direction.

12. A semiconductor storage device, comprising:
    a memory cell array, having a stacked body, that includes a cell area and a contact area provided adjacent the cell area;
    a circuit provided below the memory cell array;
    a source layer provided between the memory cell array and the circuit;
    a first contact provided in the contact area, and coupled to the circuit by extending along a stacking direction through the stacked body;
    a second contact provided over the cell area and the contact area, and coupled to the source layer by extending along the stacking direction and a first lateral direction;
    a first wiring extending in a second lateral direction intersecting an extending direction of the second contact in the contact area; and a second wiring provided above the second contact, extending in the first lateral direction along the second contact in the contact area, and connected to the first wiring;

wherein the cell area further includes a first cell area and a second cell area, the contact area between the first cell area and the second cell area in the second direction.

13. The semiconductor storage device according to claim 12, further comprising:

a plurality of third contacts provided between the second wiring and the second contact.

14. The semiconductor storage device according to claim 12, wherein the first and second wirings are provided in a same layer.

15. The semiconductor storage device according to claim 12, further comprising:

a plurality of bit lines provided in the cell area, wherein the first and second wirings and the plurality of bit lines are provided in a same layer.

16. The semiconductor storage device according to claim 12, wherein the first wiring and another first wiring are each provided along a boundary between the cell area and an adjacent cell area, which is on one of opposite sides of the contact area, and the two first wirings are commonly connected to the second wiring provided in the contact area.

17. The semiconductor storage device according to claim 12, wherein the second wiring connects the first wiring and another first wiring that are provided on opposite sides of the contact area, respectively.

18. The semiconductor storage device according to claim 12, wherein the second wiring is provided in the cell area on a first side of the contact area and another cell area on a second side of the contact area.

* * * * *